(12) United States Patent
Tanaka

(10) Patent No.: US 9,633,822 B2
(45) Date of Patent: Apr. 25, 2017

(54) GAS NOZZLE, PLASMA APPARATUS USING THE SAME, AND METHOD FOR MANUFACTURING GAS NOZZLE

(71) Applicant: KYOCERA Corporation, Kyoto-shi, Kyoto (JP)

(72) Inventor: Atsushi Tanaka, Koka (JP)

(73) Assignee: Kyocera Corporation, Kyoto (JP)

( * ) Notice: Subject to any disclaimer, the term of this patent is extended or adjusted under 35 U.S.C. 154(b) by 452 days.

(21) Appl. No.: 14/354,709

(22) PCT Filed: Oct. 30, 2012

(86) PCT No.: PCT/JP2012/077978
§ 371 (c)(1),
(2) Date: Apr. 28, 2014

(87) PCT Pub. No.: WO2013/065666
PCT Pub. Date: May 10, 2013

(65) Prior Publication Data
US 2014/0283995 A1    Sep. 25, 2014

(30) Foreign Application Priority Data
Oct. 31, 2011 (JP) .................................. 2011-239311

(51) Int. Cl.
*H01J 37/32* (2006.01)
*C04B 35/443* (2006.01)
(Continued)

(52) U.S. Cl.
CPC .......... *H01J 37/3244* (2013.01); *B24B 37/00* (2013.01); *B24B 37/04* (2013.01);
(Continued)

(58) Field of Classification Search
CPC .. H01J 37/3244; C04B 35/6261; C04B 35/03; C04B 35/44; C04B 35/62695;
(Continued)

(56) References Cited

U.S. PATENT DOCUMENTS 6,808,747 B1 * 10/2004 Shih ....................... C23C 28/044
                                                        118/715
7,699,023 B2 * 4/2010 Chen ....................... C23C 16/34
                                                        118/715
(Continued)

FOREIGN PATENT DOCUMENTS

JP         11-214365 A    8/1999
JP       2000-195807 A    7/2000
(Continued)

OTHER PUBLICATIONS

International Search Report, PCT/JP2012/077978, Jan. 23, 2013, 1 pg.

*Primary Examiner* — Rudy Zervigon
(74) *Attorney, Agent, or Firm* — Volpe and Koenig, P.C.

(57) ABSTRACT

[Object] To provide a gas nozzle which meets a requirement to suppress the fall of particles.
[Solution] A gas nozzle 4 according to an aspect of the present invention includes a columnar main body 13 formed of a ceramic sintered body provided with a through-hole 12 formed therein through which a gas flows, an exhaust port 15 of the through-hole 12 for the gas is formed in one end surface S1 of the main body 13, and the mean width of the profile elements (Rsm) of the one end surface S1 is 5 times or more the average crystalline grain diameter of the ceramic sintered body.

9 Claims, 6 Drawing Sheets

(51) Int. Cl.
*C23C 16/44* (2006.01)
*C23C 16/455* (2006.01)
*C04B 35/44* (2006.01)
*C04B 35/505* (2006.01)
*C04B 35/626* (2006.01)
*B24B 37/00* (2012.01)
*B24B 37/04* (2012.01)
*C04B 35/03* (2006.01)

(52) U.S. Cl.
CPC .............. *C04B 35/03* (2013.01); *C04B 35/44* (2013.01); *C04B 35/443* (2013.01); *C04B 35/505* (2013.01); *C04B 35/6261* (2013.01); *C04B 35/62645* (2013.01); *C04B 35/62655* (2013.01); *C04B 35/62695* (2013.01); *C23C 16/4404* (2013.01); *C23C 16/45563* (2013.01); *C04B 2235/3206* (2013.01); *C04B 2235/3208* (2013.01); *C04B 2235/3217* (2013.01); *C04B 2235/3244* (2013.01); *C04B 2235/3418* (2013.01); *C04B 2235/5436* (2013.01); *C04B 2235/786* (2013.01); *C04B 2235/94* (2013.01); *C04B 2235/963* (2013.01); *C04B 2235/9669* (2013.01)

(58) Field of Classification Search
CPC ........ C04B 35/62655; C04B 35/62645; C04B 35/505; C04B 35/443; C04B 2235/963; C04B 2235/786; C04B 2235/3244; C04B 2235/3206; C04B 2235/3418; C04B 2235/9669; C04B 2235/3217; C04B 2235/94; C04B 2235/3208; C04B 2235/5436; B24B 37/04; B24B 37/00; C23C 16/45563; C23C 16/4404
USPC ........................ 118/715; 156/345.33, 345.34
See application file for complete search history.

(56) References Cited

U.S. PATENT DOCUMENTS

| | | | |
|---|---|---|---|
| 7,780,785 B2* | 8/2010 | Chen ...................... | C23C 16/34 118/715 |
| 8,573,154 B2* | 11/2013 | Yorozuya .......... | C23C 16/45512 118/718 |
| 9,394,615 B2* | 7/2016 | Sun ........................... | C23F 1/08 |
| 2004/0089236 A1 | 5/2004 | Yokogawa et al. | |
| 2014/0283995 A1* | 9/2014 | Tanaka .................. | C04B 35/443 156/345.33 |

FOREIGN PATENT DOCUMENTS

| JP | 2004-088077 A | 3/2004 |
|---|---|---|
| JP | 2004-111686 A | 4/2004 |

* cited by examiner (a)

(b)

(a)

(b)

(a)

(b)

GAS NOZZLE, PLASMA APPARATUS USING THE SAME, AND METHOD FOR MANUFACTURING GAS NOZZLE

TECHNICAL FIELD

The present invention relates to a gas nozzle used for a plasma apparatus, such as a film formation apparatus or an etching apparatus, for manufacturing semiconductor or liquid crystal devices, a plasma apparatus using this gas nozzle, and a method for manufacturing a gas nozzle.

BACKGROUND ART

Heretofore, in a semiconductor or a liquid crystal manufacturing process, there have been used plasma apparatuses including a film formation apparatus to form a thin film on a substrate, such as a semiconductor wafer or a glass substrate, and an etching apparatus to perform microprocessing on a substrate. In the film formation apparatus, a raw material gas is steadily supplied and introduced into a reaction chamber and is then subjected to a chemical reaction, so that a thin film is formed on a substrate. In addition, in the etching apparatus, a halogenated corrosive gas is introduced therein as a raw material gas and is then plasmatized to be used as an etching gas, so that microprocessing is performed on a substrate.

As disclosed in Japanese Unexamined Patent Application Publication No. 2000-195807, those apparatuses each have a gas nozzle introduce a raw material gas. As the gas nozzle described above, a ceramic sintered body may be used. However, when a ceramic sintered body is used for the gas nozzle, although grinding processing and/or polishing processing is required to obtain a desired shape, the surface of the ceramic sintered body is damaged by the processing as described above, and hence particles are liable to fall off from the surface.

In addition, when the film formation apparatus or the etching apparatus is used, an end surface having a raw material-gas exhaust port of the gas nozzle is exposed to a gas in a reaction chamber and is damaged thereby, so that particles are liable to fall off from the end surface. When the particles are adhered to a substrate, defects are liable to be generated on the substrate in some cases.

SUMMARY OF INVENTION

The present invention provides a gas nozzle which is able to meet a requirement to suppress the fall of particles.

A gas nozzle according to an aspect of the present invention includes a columnar main body formed of a ceramic sintered body provided at least one through-hole formed therein through which a gas flows. In one end surface of the main body, an exhaust port of the through-hole for the gas is formed. A mean width of the profile elements (Rsm) of the above one end surface is 5 times or more the average crystalline grain diameter of the ceramic sintered body.

A method for manufacturing a gas nozzle according to an aspect of the present invention includes the steps of: preparing a columnar main-body sintered body which is formed of a ceramic sintered body provided with a through-hole formed therein; performing first lapping processing on one end surface of the main-body sintered body using a first polishing agent; and forming a columnar main body from the ceramic sintered body provided with the through-hole formed therein through which a gas flows by performing second lapping processing using a second polishing agent having a hardness lower than that of the first polishing agent on the one end surface of the main-body sintered body on which the first lapping processing is performed.

The gas nozzle according to an aspect of the present invention is able to suppress the fall of particles.

The method for manufacturing a gas nozzle according to an aspect of the present invention is able to form a gas nozzle which suppresses the fall of particles.

DESCRIPTION OF EMBODIMENTS

Gas Nozzle

Hereinafter, a gas nozzle according to one embodiment of the present invention will be described in detail with reference to FIGS. 1 and 2.

Figure 1:
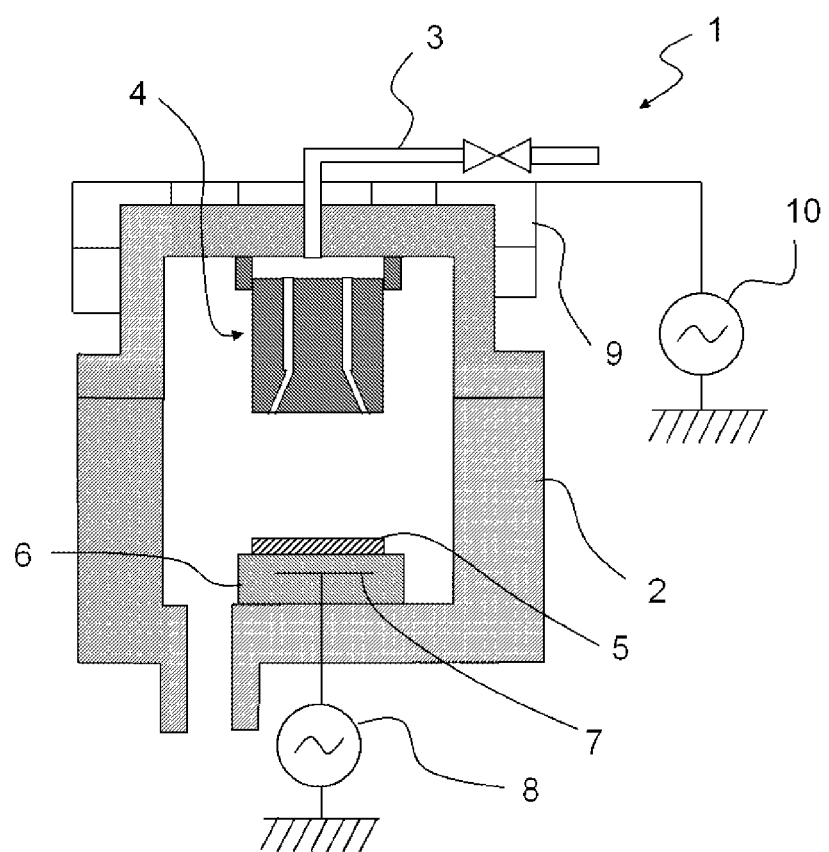
FIG. 1 is a cross-sectional view showing a structural example of a film formation apparatus using a gas nozzle according to an embodiment of the present invention.
Figure 2:
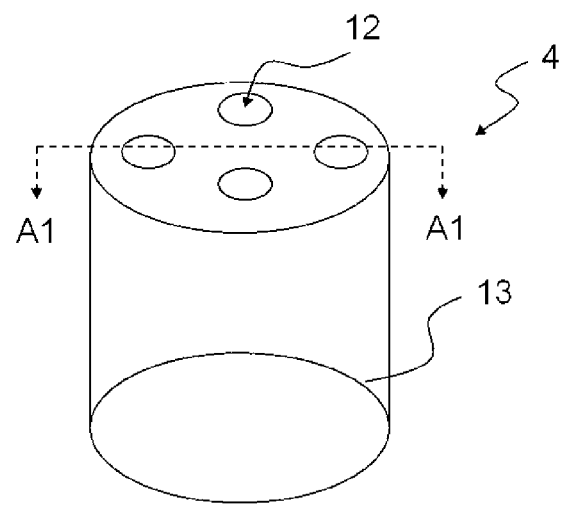
FIG. 2(a) is a perspective view showing a structural example of the gas nozzle shown in FIG. 1.
FIG. 2(b) is a cross-sectional view taken along the line A1-A1 of FIG. 2(a).
Figure 2:
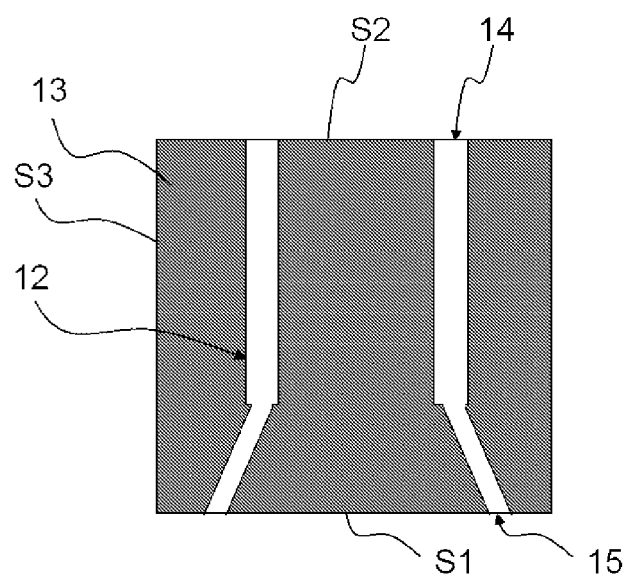

As shown in FIG. 1, a film formation apparatus 1 using the gas nozzle according to this embodiment is an apparatus which forms a thin film on a substrate 5, such as a semiconductor wafer or a glass substrate, for example, by a plasma CVD method. The film formation apparatus 1 includes a reaction chamber 2 forming a thin film; a gas inlet tube 3 introducing a raw material gas into the reaction chamber 2; a gas nozzle 4 provided in the reaction chamber 2 and connected to the gas inlet tube 3; a substrate holding portion 6, such as an electrostatic chuck, which is provided with an internal electrode 7 and on which the substrate 5 is disposed in the reaction chamber 2; a bias power source 8 provided outside the reaction chamber 2 and connected to the internal electrode 7; and a coil 9 and a power source 10 which are provided outside the reaction chamber 2 to generate plasma in the reaction chamber 2. The coil 9 and the power source 10 form a discharge device to discharge a raw material gas supplied into the reaction chamber.

In the film formation apparatus 1 as described above, a raw material gas supplied from the gas nozzle 4 is plasmatized above the substrate 5 by discharge caused by the coil 9 and the power source 10, and a thin film is formed on the substrate 5 by deposition. For example, when a silicon oxide ($SiO_2$) insulating thin film is formed on the substrate 5, raw materials gases, such as a silane ($SiH_4$) gas, an argon (Ar) gas, and an oxygen ($O_2$) gas, are supplied, and when an unnecessary deposit is removed by cleaning, a cleaning gas, such as a trifluoronitride ($NF_3$) gas or a octafluoropropane ($C_3F_8$) gas, is supplied.

Next, the gas nozzle 4 used in the film formation apparatus 1 will be described. As shown in FIG. 2, the gas nozzle 4 according to this embodiment has a main body 13 provided with through-holes 12 through which a gas flows. The main body 13 is formed to have a columnar shape, and for example, the columnar shape is a cylindrical shape having a bottom surface (one end surface S1), a top surface (the other end surface S2), and a side surface S3 connected to the one end surface S1 and the other end surface S2. The through-hole 12 is a flow path through which a gas flows and has a supply port 14 to which a gas is supplied and an exhaust port 15 from which a gas is exhausted. In the gas nozzle 4 shown in FIG. 2, the supply ports 14 and the exhaust ports 15 are provided in the top surface (the other end surface S2) and the bottom surface (the one end surface S1), respectively, of the cylinder.

Since the one end surface S1 and the other end surface S2 are exposed to plasma in the reaction chamber 2, from a plasma resistance point of view, the main body 13 of the gas nozzle described above preferably uses a ceramic sintered body and more preferably uses a ceramic sintered body containing as a primary component a ceramic material having a higher plasma resistance than that of aluminum oxide ($Al_2O_3$), that is, alumina. As the ceramic sintered body having a high plasma resistance as described above, there may be used a ceramic sintered body containing as a primary component a rare earth-containing ceramic material, such as yttria ($Y_2O_3$) or yttrium-aluminum-garnet (YAG), or a ceramic sintered body containing magnesium aluminate ($MgAl_2O_4$), that is, spinel, as a primary component.

When the main body 13 is formed of an yttria sintered body, since the plasma resistance is improved, even if the gas nozzle 4 is used in an atmosphere containing a plasma-tized corrosive gas or an atmosphere having a high plasma density, a long life can be maintained. In the case described above, the main body 13 contains 99 to 99.99 percent by volume of yttria as a primary component and 0.01 to 1 percent by volume of zirconium (Zr), silicon (Si), or the like as a sintering auxiliary agent.

In addition, when the main body 13 is formed of a spinel sintered body, the spinel sintered body has a plasma resistance at a certain level or more and is superior in mechanical and thermal characteristics to a rare earth-containing ceramic sintered body, such as yttria. In the case described above, the main body 13 contains 90 to 99.9 percent by volume of spinel as a primary component and 5 to 10 percent by volume of calcium (Ca), zirconium, magnesium (Mg), or the like as a sintering auxiliary agent. In particular, as the sintering auxiliary agent for the spinel sintered body, calcium or zirconium is preferably used. As a result, the plasma resistance can be enhanced.

Figure 3:
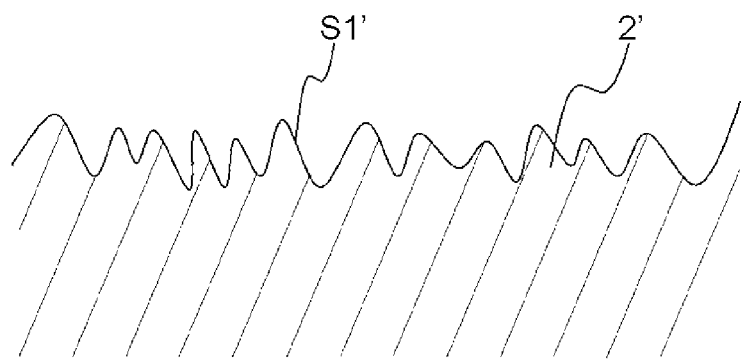
FIG. 3(a) is an enlarged cross-sectional view showing a surface condition of one end surface of a main body of a related gas nozzle.
FIG. 3(b) is an enlarged cross-sectional view showing a surface condition of one end surface of a main body of the gas nozzle shown in FIG. 1.
Figure 3:
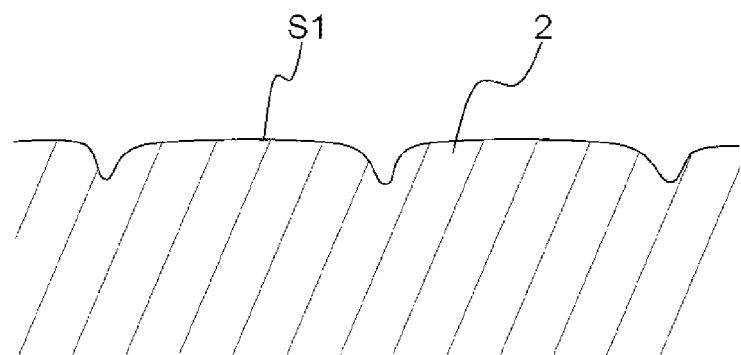

Incidentally, since being provided with the exhaust port and directly brought into contact with a plasmatized corrosive gas in the reaction chamber, the one end surface of the main body is liable to be attacked by the corrosive gas. In particular, if a recess is formed in the one end surface, the recess is attacked by the corrosive gas, and as a result, particles are liable to fall off. In general, although an arithmetic average roughness (Ra) has been known as an index indicating the surface condition, since indicating the arithmetic average height of contour curves, this arithmetic average roughness (Ra) is influenced by the height of the recess. Hence, even if the arithmetic average roughness (Ra) is small, it does not always indicate that the number of recesses in the one end surface of the main body is reduced. In addition, in related polishing processing, even if the arithmetic average roughness (Ra) is decreased by decreasing the heights of irregularities generated by firing and/or grinding processing, crystalline grains are crushed by a stress generated in polishing processing, and minute recesses are newly formed. Hence, as a result, as shown in FIG. 3(*a*), the number of recesses in one end surface S1' of a main body 13' may not be reduced. That is, a mean width of the profile elements (Rsm) indicating the length between adjacent recesses cannot be increased with respect to the average crystalline grain diameter. As a result, since the recesses are attacked by a corrosive gas, particles are liable to fall off.

On the other hand, in this embodiment, in consideration of the number of recesses in the one end surface S1 of the main body 13, the crystalline grains are suppressed from being crushed during processing by the use of polishing processing of this embodiment which will be described later, and as shown in FIG. 3(*b*), the number of recesses in the one end surface S1 of the main body 13 is reduced, so that the mean width of the profile elements (Rsm) of the one end surface S1 of the main body 13 is set to 5 times or more the average crystalline grain diameter of the ceramic sintered body. As a result, since the number of recesses in the one end surface S1 of the main body 13 is reduced, even if the one end surface S1 is directly brought into contact with a plasma-tized corrosive gas in the reaction chamber 2, the fall of particles can be suppressed, and hence, defects can be suppressed from being generated on a wafer.

In particular, when an yttria sintered body or a spinel sintered body is used as the main body 13, although the sintered body as described above has a low material strength as compared to that of an alumina sintered body, and crystalline grains are liable to be crushed during general polishing processing, since the crystalline grains are suppressed from being crushed during processing by the use of the above polishing processing of this embodiment which will be described later, the mean width of the profile elements (Rsm) of the one end surface S1 of the main body 13 can be set to 5 times or more the average crystalline grain diameter of the ceramic sintered body.

In this embodiment, the mean width of the profile elements (Rsm) is in accordance with JISB0601: 2001, is a lateral-direction parameter of a roughness curve measured using a surface roughness meter, and is an average value of lengths between irregularities in a unit length. The degree of particle fall can be determined by the mean width of the profile elements (Rsm), and it is indicated that as the mean width of the profile elements (Rsm) is increased, the degree of crushing of crystalline grains by polishing processing is decreased.

In addition, the mean width of the profile elements (Rsm) of the one end surface S1 of the main body 13 is set, for example, to 100 times or less the average crystalline grain diameter of the ceramic sintered body. In addition, the arithmetic average roughness (Ra) of the one end surface S1 of the main body 13 is set, for example, to 0.05 μm or less. Incidentally, the definition of the arithmetic average roughness (Ra) is in accordance with JISB0601: 2001.

Figure 4:
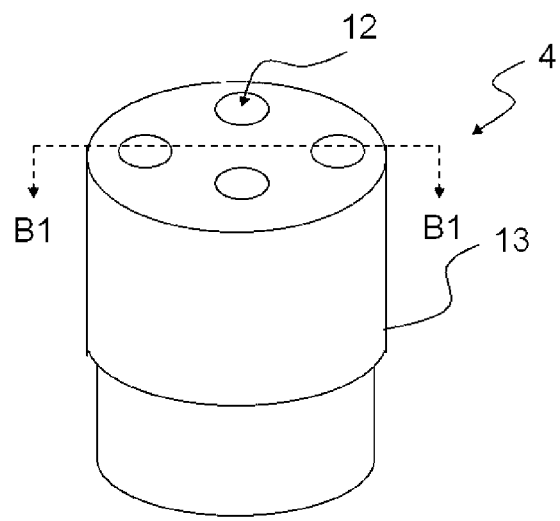
FIG. 4(a) is a perspective view showing a structural example of a gas nozzle according to an embodiment of the present invention.
FIG. 4(b) is a cross-sectional view taken along the line B1-B1 of FIG. 4(a).
Figure 4:
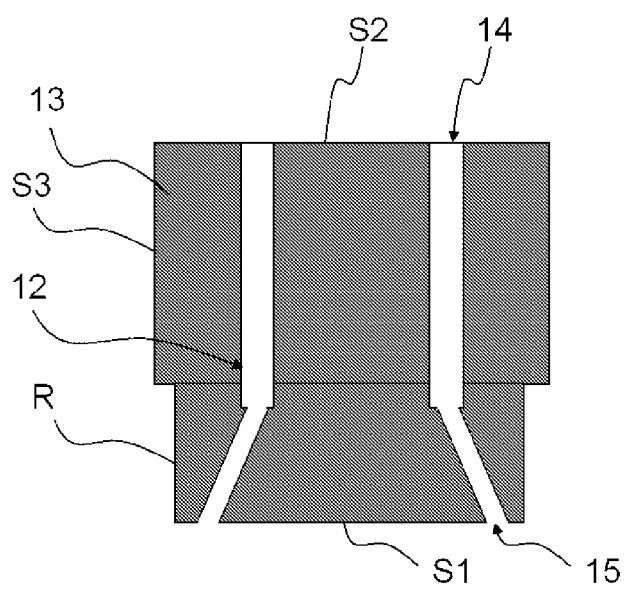

In addition, as shown in FIG. 4, in the side surface S3 of the main body 13, the mean width of the profile elements (Rsm) is preferably 5 times or more the average crystalline grain diameter of the ceramic sintered body. As a result, particles can also be suppressed from falling off from the side surface S3 of the main body 13 with which a plasmatized corrosive gas in the reaction chamber is directly brought into contact. In addition, the mean width of the profile elements (Rsm) of a region R of the side surface S3 located at the one end surface S1 side shown in FIG. 4 is only set to 5 times or more the average crystalline grain diameter of the ceramic sintered body. As a result, the plasma resistance of the region R which is liable to be in contact with a corrosive gas can be enhanced. In addition, the width of a part of the main body 13 shown in FIG. 4 having the region R as the side surface is smaller than the width of the other part of the main body 13.

In order to simplify a processing process, the polishing processing of this embodiment described above may not be performed on the other end surface S2 of the main body 13. In this case, the mean width of the profile elements (Rsm) is, for example, 2 to 4 times the average crystalline grain diameter of the ceramic sintered body.

<Method for Manufacturing Gas Nozzle>

Next, one example of a method for manufacturing a gas nozzle according to this embodiment will be described. The method for manufacturing a gas nozzle includes a step of forming a ceramic sintered body to be used as the main body 13 and a step of processing the ceramic sintered body to obtain a main body 13 having a desired shape.

(Formation of Ceramic Sintered Body)

First, the case in which the main body 13 is formed from an yttria sintered body will be described.

First, after purified water and an organic binder are added to an yttria powder, wet mixing is performed using a ball mill, so that a slurry is formed. Subsequently, the slurry is granulated by spray drying. By the use of the yttria powder thus granulated, a molded article having a predetermined shape is obtained by an arbitrary molding method, such as a mold pressing method or a cold isostatic pressing molding method (CIP molding method). In addition, if necessary, after the molded article is degreased at 400° C. to 600° C., and the organic binder is decomposed, by firing at 1,400° C. to 1,700° C. in an air atmosphere or an oxygen atmosphere, the yttria sintered body can be obtained.

Next, the case in which the main body 13 is formed from a spinel sintered body will be described.

First, after high purity magnesium hydroxide ($Mg(OH)_2$) and aluminum oxide ($Al_2O_3$), which are starting raw materials, are prepared and weighed to have a predetermined ratio, wet mixing is performed using a ball mill, so that a primary raw material is obtained. Next, after the primary raw material is dried, calcination thereof is performed at a temperature of 1,100° C. to 1,300° C., so that a calcined product is obtained. Subsequently, the calcined product is wet-pulverized by a ball mill or the like to have an average grain diameter of 2 μm or less and preferably 1.5 μm or less, so that a slurry is obtained. In addition, after the slurry is transferred to a container and is then dried in a drying machine, sieving is performed using a mesh, so that a calcined powder is obtained. In addition, although calcium and zirconium may be added during mixing and pulverizing performed to obtain the primary raw material, they may also be added to this calcined powder.

Next, after predetermined amounts of purified water and a binder are added to the calcined powder, wet mixing is performed for a predetermined time using a ball mill or the like, and spray granulation is then performed by a spray dryer, so that a secondary raw material is obtained. Subsequently, by the use of this secondary raw material, a molded article having a predetermined shape is obtained by an arbitrary molding method, such as a mold pressing method or a cold isostatic pressing molding method. Next, the molded article is fired in an air atmosphere at a temperature of 1,550° C. to 1,750° C., so that the spinel sintered body of this embodiment can be obtained. In addition, in order to promote the densification, a hot isostatic pressing method may also be used.

The yttria sintered body and the spinel sintered body obtained as described above are each a sintered body before the through-holes 12 of the main body 13 are formed and are each hereinafter referred to as "main-body sintered body 13".

(Processing of Ceramic Sintered Body)

Processing performed so that the main-body sintered body 13 has a desired shape will be described.

First, by grinding processing, an exterior shape of the main-body sintered body 13 is formed, and the through-holes 12 are formed therein. Next, by polishing processing, one end surface S1 of the main-body sintered body 13 is polished.

Hereinafter, the polishing processing of the one end surface S1 of the main-body sintered body 13 formed of the yttria sintered body or the spinel sintered body will be described in detail.

Figure 5:
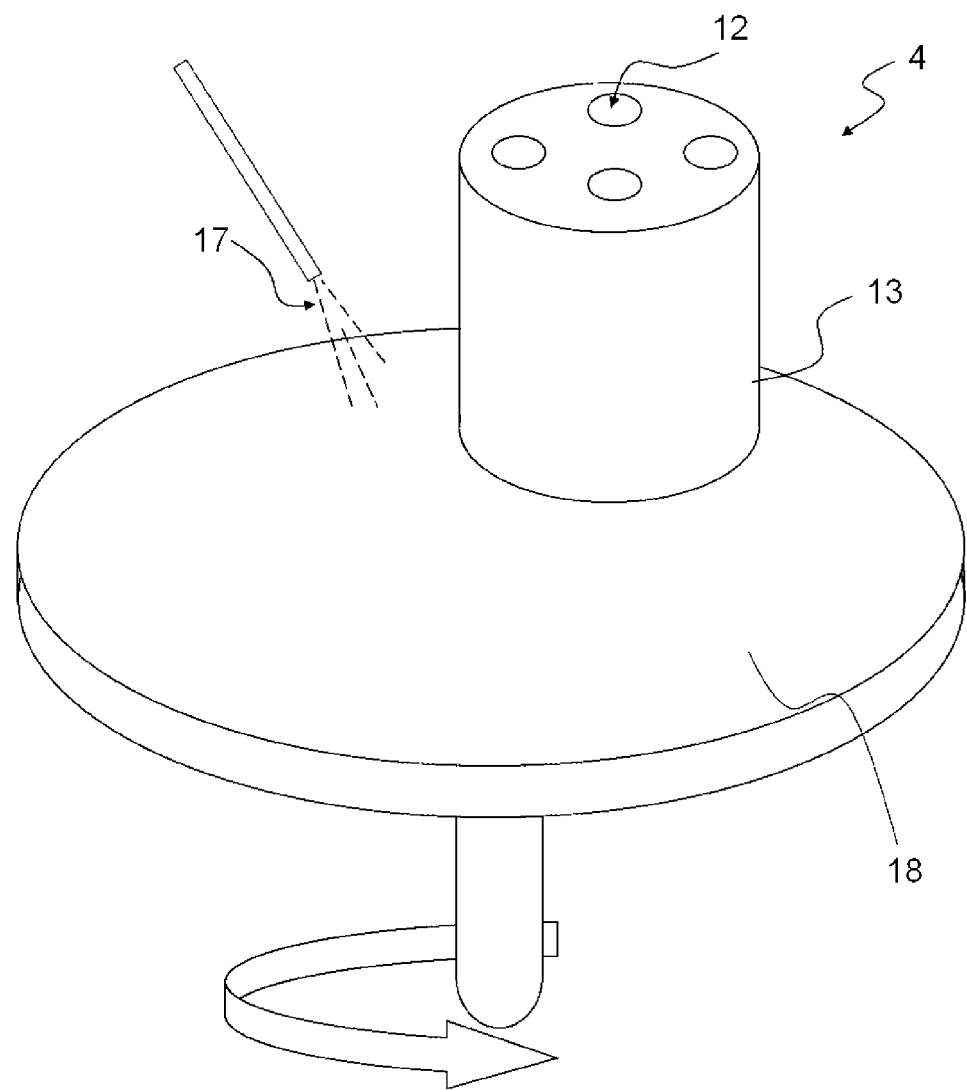
FIG. 5 is a schematic view showing a method for manufacturing a gas nozzle according to en embodiment of the present invention and a method for performing finish processing on one end surface (surface in contact with a gas in a reaction chamber) of a main body.

To begin with, first lapping processing is performed using a diamond polishing agent and a cast iron-based lapping machine. Next, as shown in FIG. 5, second lapping processing (finish processing) is performed using a polishing agent 17 formed of a soft material having a hardness lower than that of the diamond polishing agent and a lapping machine 18, such as a soft type polishing pad. As the polishing agent used in this finish processing, for example, there may be used an alumina polishing agent having a Mohs hardness of 9 or a ceria polishing agent having a Mohs hardness of 2.5. The hardness of the polishing agent is appropriately selected in accordance with a ceramic sintered body to be processed. In particular, for example, in the case of the yttria sintered body, an alumina polishing agent having an average grain diameter of 1 μm may be used, and finishing processing may be performed on a polyurethane pad for approximately 2 to 10 hours.

Accordingly, by the first lapping processing using a diamond polishing agent, although crystalline grains of the yttria sintered body or the spinel sintered body, each of which has a low material strength, are crushed by a stress generated in the processing, and a crushed layer is formed thereby, since the finish processing using a polishing agent formed from a soft material is additionally performed, polishing can be performed while the crystalline grains are suppressed from being crushed. Hence, the crushed layer of crystalline grains generated in the first lapping processing can be removed. In addition, since the arithmetic average roughness (Ra) of the one end surface S1 is decreased by the first lapping processing before the second lapping processing is performed, the processing time can also be shortened.

In addition, when the gas nozzle shown in FIG. 4 is formed, polishing processing of the one region R of the side surface S3 of the main-body sintered body 13 may be performed as described below.

Figure 6:
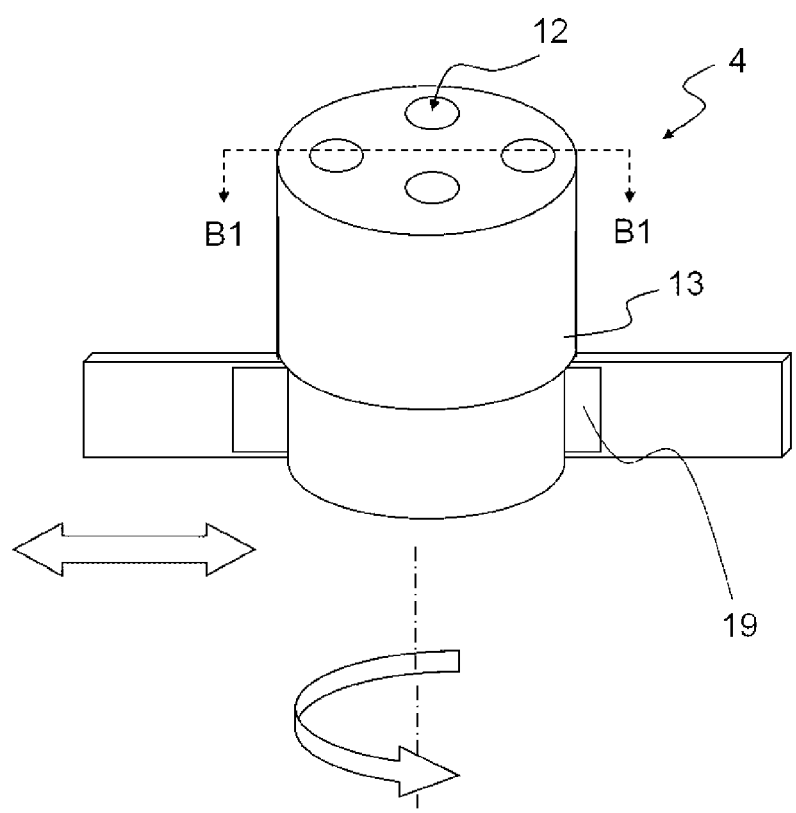
FIG. 6 is a schematic view showing a method for manufacturing the gas nozzle shown in FIG. 4 and a method for performing finish processing on a side surface connected to one end surface.

First, cylindrical grinding is performed using a fixed grinding stone. Next, as shown in FIG. 6, second lapping processing (finish processing) is performed using a jig 19 to which a soft type polishing pad is adhered and a polishing agent formed of a soft material having a hardness lower than that of a diamond polishing agent. As the polishing agent used in this finish polishing, the same agent as that used for the above finish polishing of the one end surface S1 may be used. In addition, in particular, for example, in the case of the yttria sintered body, an alumina polishing agent having a size of 1 μm may be used, and finish processing may be performed for approximately 2 to 10 hours using a jig to which a polyurethane pad is adhered.

As described above, the gas nozzle 4 can be formed.

The present invention is not limited to the embodiments described above, and for example, those embodiments may be variously changed, improved, and combined with each other without departing from the scope of the present invention.

For example, in the embodiment described above, although the structure in which the gas nozzle is used for a film formation apparatus is described by way of example, the gas nozzle may also be used for other semiconductor manufacturing apparatuses and liquid crystal manufacturing apparatuses and may also be used, for example, for an etching apparatus.

In addition, in the embodiment described above, although the structure in which the exhaust port is formed in the one end surface of the columnar main body is described by way of example, the exhaust port may be formed in any surface of the main body which is exposed to the inside of the reaction chamber and may be formed, for example, in the side surface of the main body. In the case described above, the mean width of the profile elements (Rsm) of the side surface of the main body is preferably set to 5 times or more the average crystalline grain diameter of the ceramic sintered body.

EXAMPLES

Hereinafter, although the present invention will be described in detail with reference to examples, the present invention is not limited to the following examples, and changes and embodiments, which are within the scope of the present invention, are both within the range of the present invention.

(Evaluation Method)

As shown in Table 1, after gas nozzles of Samples 1 to 15 were formed using various types of ceramic sintered bodies and processing methods, the surfaces of the gas nozzles were each observed by a digital microscope device manufactured by Keyence Corporation, so that the average crystalline grain diameter (D) of one end surface of a main body was measured. In addition, the surface condition of each gas nozzle was measured by a surface roughness meter manufactured by Kosaka Laboratory Ltd., so that the mean width of the profile elements (Rsm) and the arithmetic average roughness (Ra) of the one end surface of the main body were measured. In addition, plasma etching evaluation was performed on each gas nozzle using a plasma etching apparatus manufactured by Anelva Corp., so that the plasma resistance was evaluated. Incidentally, the plasma resistance was evaluated using a relative value with reference to the value of Sample 1, and a smaller numerical value indicates a higher plasma resistance.

(Formation Conditions of Gas Nozzle)

First, yttria sintered bodies (Samples 1 to 6) and spinel sintered bodies (Samples 7 to 12) were formed.

The yttria sintered body was formed as described below. First, after purified water and a binder were added to an yttria powder, wet mixing was performed using a ball mill, so that a slurry was formed. Next, after the slurry was granulated by spray drying, a molded article was formed by a CIP molding method and was then fired in an air atmosphere at 1,400° C. to 1,700° C.

The spinel sintered body was formed as described below. First, after magnesium hydroxide and aluminum oxide were mixed together at a ratio of 1:1, wet mixing was performed using a ball mill, so that a primary raw material was formed. In addition, after a calcined product was formed by calcining the primary raw material at a temperature of 1,100° C. to 1,300° C., the calcined product was wet-pulverized using a ball mill or the like to have an average grain diameter of 2 μm, so that a slurry was obtained. Subsequently, after the slurry was dried, sieving was performed using a mesh, so that a calcined powder having an average grain diameter of 1.5 μm was formed. Next, after purified water and a binder were added to the calcined powder, wet mixing was performed using a ball mill, so that a slurry was formed. Subsequently, after the slurry was granulated by a spray drier, a molded article was formed by a CIP molding method or the like and was then fired in an air atmosphere at a temperature of 1,550° C. to 1,750° C.

Next, after through-holes were formed in the ceramic sintered body by grinding processing, polishing processing was performed on one end surface thereof. In the polishing processing, the first lapping processing was only performed on some of the sintered bodies (Samples 1 to 3 and 7 to 9), and the first lapping processing and the second lapping processing were sequentially performed in this order on the other sintered bodies (Samples 4 to 6 and 10 to 12).

The first lapping processing was performed on a cast-iron bases lapping machine for a predetermined time using a diamond polishing agent having an average grain diameter of 2 μm. The second lapping processing was performed on a polyurethane pad for 2 hours using an alumina polishing agent having an average grain diameter of 1 μm.

TABLE 1

| Sample | Sintered Body | Processing Method | D (μm) | Rsm (μm) | Ra (μm) | Plasma Resistance | Rsm/D |
|---|---|---|---|---|---|---|---|
| 1 | Yttria Sintered Body | Only First Lapping | 10 | 40 | 0.06 | 1 | 4 |
| 2 | | | | 30 | 0.08 | — | 3 |
| 3 | | | | 30 | 0.07 | — | 3 |
| 4 | | First Lapping + Second Lapping | 10 | 190 | 0.01 | 0.9 | 19 |
| 5 | | | | 100 | 0.01 | — | 10 |
| 6 | | | | 90 | 0.02 | — | 9 |
| 7 | Spinel Sintered Body | Only First Lapping | 15 | 30 | 0.04 | 1.3 | 2 |
| 8 | | | | 50 | 0.03 | — | 3 |
| 9 | | | | 40 | 0.02 | — | 3 |
| 10 | | First Lapping + Second Lapping | 15 | 150 | 0.01 | 1.2 | 10 |
| 11 | | | | 180 | 0.01 | — | 12 |
| 12 | | | | 100 | 0.01 | — | 7 |

(Results)

As shown in Table 1, although Rsm/D of each of Samples 1 to 3 and 7 to 9 on which the first lapping processing was only performed was decreased to 2 to 4 times, on the other hand, Rsm/D of each of Samples 4 to 6 and 10 to 12 on which the second lapping processing was performed following the first lapping processing was increased to 7 to 20 times. In addition, of the samples in which the yttria sintered body was used as the ceramic sintered body, Sample 4 on which the second lapping processing was performed following the first lapping processing was improved in plasma resistance as compared to Sample 1 on which the first lapping processing was only performed. In addition, of the samples in which the spinel sintered body was used as the ceramic sintered body, Sample 10 on which the second lapping processing was performed following the first lapping processing was improved in plasma resistance as compared to Sample 7 on which the first lapping processing was only performed.

From the results described above, according to the gas nozzle of the present invention, when the mean width of the profile elements (Rsm) of the one end surface of the main body is set to 5 times or more the average crystalline grain diameter (D) of the ceramic sintered body, the plasma resistance can be improved; hence, it was confirmed that when the one end surface of the main body is exposed to a plasmatized gas, the fall of particles can be suppressed.

REFERENCE SIGNS LIST

1 film formation apparatus
2 reaction chamber
3 gas inlet tube
4 gas nozzle
5 substrate
6 substrate holding portion
7 internal electrode
8 bias power source
9 coil
10 power source
12 through-hole
13 main body
14 supply port
15 exhaust port
17 polishing agent
18 lapping machine
19 jig

The invention claimed is:

1. A gas nozzle comprising: a columnar main body formed of a ceramic sintered body provided with at least one through-hole formed therein through which a gas flows, wherein the through-hole has an exhaust port for the gas formed in one end surface of the main body, and a mean width of profile elements (Rsm) of the one end surface is 5 times or more the average crystalline grain diameter of the ceramic sintered body.

2. The gas nozzle according to claim 1,
wherein the arithmetic average roughness (Ra) of the one end surface is 0.05 µm or less.

3. The gas nozzle according to claim 1,
wherein the mean width of the profile elements (Rsm) of the one end surface is 100 times or less the average crystalline grain diameter of the ceramic sintered body.

4. The gas nozzle according to claim 1,
wherein the mean width of the profile elements (Rsm) of a side surface of the main body connected to the one end surface is 5 times or more the average crystalline grain diameter of the ceramic sintered body.

5. The gas nozzle according to claim 4,
wherein the exhaust ports are formed in the main body, and at least one of the exhaust ports is also formed in the side surface.

6. The gas nozzle according to claim 1,
wherein the ceramic sintered body contains yttria as a primary component.

7. The gas nozzle according to claim 1,
wherein the ceramic sintered body contains spinel as a primary component.

8. The gas nozzle according to claim 7,
wherein the ceramic sintered body contains at least one of calcium and zirconium.

9. A plasma apparatus comprising:
a reaction chamber;
the gas nozzle according to claim 1 which supplies a gas in the reaction chamber; and
a discharge device to plasmatize the gas by discharge.

* * * * *